(12) United States Patent
Schaffarz et al.

(10) Patent No.: US 10,880,996 B2
(45) Date of Patent: Dec. 29, 2020

(54) FLEXIBLE LED STRIP

(71) Applicant: LED-Linear GmbH, Neukirchen-Vluyn (DE)

(72) Inventors: Carsten Schaffarz, Neukirchen-Vluyn (DE); Michael Kramer, Kamp-Lintfort (DE); Soeren Bleul, Duisburg (DE); Peter Schoepper, Issum (DE); Dennis Schuettler, Krefeld (DE)

(73) Assignee: LED-LINEAR GMBH, Neukirchen-Vluyn (DE)

( * ) Notice: Subject to any disclaimer, the term of this patent is extended or adjusted under 35 U.S.C. 154(b) by 0 days.

(21) Appl. No.: 16/251,199

(22) Filed: Jan. 18, 2019

(65) Prior Publication Data

US 2019/0230782 A1 Jul. 25, 2019

(30) Foreign Application Priority Data

Jan. 24, 2018 (DE) .......................... 10 2018 000 549

(51) Int. Cl.
*H05K 1/02* (2006.01)
*H01L 25/075* (2006.01)
(Continued)

(52) U.S. Cl.
CPC ........... *H05K 1/028* (2013.01); *F21V 19/005* (2013.01); *H01L 25/0753* (2013.01);
(Continued)

(58) Field of Classification Search
CPC .... G06F 1/1626; G06F 1/1686; G06F 3/0412; G06F 3/044; G06F 2203/04105
See application file for complete search history.

(56) References Cited

U.S. PATENT DOCUMENTS

| 8,534,864 | B2* | 9/2013 | Forteza | ................... | F21V 19/00 |
| | | | | | 362/223 |
| 2010/0255705 | A1* | 10/2010 | Higuchi | ................. | H01R 12/88 |
| | | | | | 439/329 |

* cited by examiner

*Primary Examiner* — Tony Tran
(74) *Attorney, Agent, or Firm* — Andrew Wilford (57) ABSTRACT

The invention relates to a flexible printed-circuit strip to whose upper face and/or lower face electronic components can be or are mounted, wherein it is subdivided in the direction of its longitudinal extension (L) into first and second surface zones (F1, F2) and it is subdivided perpendicular to the longitudinal direction (L) into a first edge region (SB1) and a second edge region (SB2), the two strip portions (SB1, SB2) being on both sides of a common longitudinal line (LL), wherein all the first surface zones (F1) are arranged in the first edge region (SB1) and all the second surface zones (F2) are arranged in the second edge region (SB2), and wherein first and second surface zones (F1, F2) that are adjacent in longitudinal direction (L) are respectively connected by a connecting web (V) that crosses the longitudinal line (LL). The invention further relates to a flexible printed-circuit strip that is subdivided in the direction of its longitudinal extension (L) into first and second surface zones (F1, F2) in the direction of its longitudinal extension (L), wherein the first surface zones (F1) are arranged on a first plane and the second surface zones (F2) are arranged on a second plane that is oriented differently from the first, and wherein a connecting web (V) that extends perpendicular to the longitudinal direction (L) is embodied so as to be bent about a bend line (BL) that is parallel to the longitudinal direction (L). The invention also relates to an LED luminaire comprising such a printed-circuit strip.

15 Claims, 3 Drawing Sheets

(51) Int. Cl.
  *H01L 33/62* (2010.01)
  *H01L 33/48* (2010.01)
  *H05K 1/03* (2006.01)
  *F21V 19/00* (2006.01)
  *F21Y 115/10* (2016.01)
  *H05K 1/18* (2006.01)
  *F21Y 103/10* (2016.01)

(52) U.S. Cl.
  CPC ............ *H01L 33/483* (2013.01); *H01L 33/62* (2013.01); *H05K 1/0326* (2013.01); *H05K 1/0346* (2013.01); *F21Y 2103/10* (2016.08); *F21Y 2115/10* (2016.08); *H05K 1/181* (2013.01); *H05K 2201/056* (2013.01); *H05K 2201/09027* (2013.01); *H05K 2201/09263* (2013.01); *H05K 2201/09272* (2013.01); *H05K 2201/10106* (2013.01); *H05K 2203/1316* (2013.01)

FLEXIBLE LED STRIP

FIELD OF THE INVENTION

The invention relates to a flexible printed-circuit strip whose upper face and/or lower face electronic components, particularly light-emitting diodes or sensors, can be or are mounted.

BACKGROUND OF THE INVENTION

Flexible printed-circuit strips are known from the prior art. Such flexible printed-circuit strips are normally also referred to simply as flexible boards or flexible circuit boards. Such flexible circuit boards or printed-circuit strips usually comprise a film, such as a polyimide film, that provides the flexibility and is provided with conductive traces and/or electronic components.

In the context of the invention, a printed-circuit strip is preferably understood as referring to a flexible board that is strip-shaped and thus has a longitudinal extension that is greater than the width of the printed-circuit strip perpendicular to the longitudinal direction, particularly many times greater, preferably at least 10 times greater.

By using such flexible printed-circuit strips, it is possible to conductively interconnect moving electronic components without any damage to the electrical connection during movement. What is more, such a flexible printed-circuit strip can be used to form electronic arrangements that are inherently mobile, particularly bendable.

According to the prior art, the printed-circuit strips are formed substantially on a single plane, which imparts mobility, particularly bendability to such printed-circuit strips only at bend lines that lie on this plane or are parallel to it. Deflection of a flexible board or flexible printed-circuit strip of this type about a bending axis perpendicular to this plane without damage is not possible, as such bending results in the printed-circuit strip being pulled along one of its printed-circuit strip edges and compressed along the opposite printed-circuit strip edge, causing the printed-circuit strip to buckle out of the plane, leading to a damage of the electronic components mounted on the printed-circuit strip and potentially to the destruction thereof.

It is known in the prior art to also use such planar printed-circuit strips in LED luminaires, for example, in which light-emitting diodes are mounted on the surface of such a printed-circuit strip, for example with equidistant spacing, with it being possible for such a flexible printed-circuit strip that is carrying the light-emitting diodes to be incorporated, particularly embedded, in a flexible, likewise longitudinally extended casing, thus producing a hermetic seal.

Consequently, such a flexible LED luminaire is thus bendable in the same way as the flexible printed-circuit strip that is embedded therein, namely only about such bending axes in or parallel to the plane of the printed-circuit strip. By bending such a flexible LED luminaire about a bending axis perpendicular to the plane of the printed circuit board, a great risk exists of damaging the electronic components mounted on the printed-circuit strip and the strip itself, especially since the casting of the strip prevents it from buckling at the printed-circuit strip edge.

Therefore, different variants of flexible, bendable strip-type LED luminaires have been marketed by various suppliers and by the applicant of the present invention, for example, that have flexible casings in which elongated printed-circuit strips are embedded, each configured for different bending directions.

Particularly LED luminaires with such a flexible casing in which a flexible printed-circuit strip is cast with the possibility of bending in two different, for example mutually perpendicular axes are not yet known in the art.

The limitation of the bending direction applies not only to the LED luminaires mentioned above and those that are preferred in practice, but also to any other electronics in which such flexible printed-circuit strips are used.

OBJECT OF THE INVENTION

It is therefore an object of the present invention to provide an improved printed-circuit strip that can be bent about several different bending axes perpendicular to the direction of its longitudinal extension. In particular, it is a preferred further object to provide an LED luminaire with a flexibly bendable casing in which the use of a printed-circuit strip according to the invention enables bending about differently oriented bend axes, particularly in order to develop two mutually perpendicular bending axes.

SUMMARY OF THE INVENTION

This object is achieved in that a flexible printed-circuit strip of the type described above is subdivided in the direction of its longitudinal extension into first and second surface zones that particularly alternate with one another in the longitudinal direction, and that the printed-circuit strip is further subdivided perpendicular to the direction of its longitudinal extension into a first edge region and a second edge region, wherein the two strip portions, particularly if they are on the same common printed-circuit strip plane, flank a common longitudinal line, wherein all the first surface zones are in the first edge region and all the second surface zones are in the second edge region, and wherein longitudinally adjacent first and second surface are interconnected by connecting webs that cross the longitudinal line, particularly orthogonally.

Such a flexible printed-circuit strip can comprise any desired electronic components on its upper face and/or lower face in addition to the conductive traces that are also on the upper/lower face.

Such electronic components can be light-emitting diodes or sensors, for example. The term "light-emitting diode" refers not only to respective individual light-emitting diodes, but also to assemblies of light-emitting diodes such as of so-called COB (Chip On Board) designs in which a plurality of individual light-emitting diodes are mounted on a common substrate. According to the invention, such arrangements or assemblies of light-emitting diodes are also referred to hereinafter collectively as a "light-emitting diode."

A provision can be made according to the invention that at least a portion of the first surface zones, preferably all the first surface zones and/or at least a portion of the second surface zones, preferably all the second surface zones, carry electronic components of the above-mentioned type and thus sensors in particular or preferably LEDs. In that case, such electronic components can be on the respective upper face and/or also lower face of the cited first and/or second surface zones.

The above-described longitudinal line flanked by the edge regions is to be preferably understood as an imaginary longitudinal line and not as one that is structurally present, by tracing on the printed-circuit strip, for example, although such a graphic representation of a longitudinal line can be provided.

Such a particularly imaginary longitudinal line lies within the width of the flexible printed-circuit strip and can but need not extend in the center relative to the width of the printed-circuit strip. The width of the strip is measured here in a direction that is perpendicular to the longitudinal direction and lies on a common plane of both the first and the second surface zones. In particular, according to the invention the longitudinal line is expressly not centered relative to the width of the printed-circuit strip or extends offset from the center.

A printed-circuit strip of the above-mentioned inventive type opens up the possibility that this printed-circuit strip can be bent not only about bend lines that are parallel to the common printed-circuit strip plane described above for the sake of example, but also about bend lines that are perpendicular to this cited printed-circuit strip plane. To wit, if a bend is made about a bend line perpendicular to the common printed-circuit strip plane, then the succession of first and second surface zones, which can, for example, be spaced longitudinally of the strip on the left and on the right side of the printed-circuit strip when viewed along the longitudinal direction of the strip, makes it possible for the buckling described above in relation to the prior art to form in a stress-free manner on the printed-circuit strip according to the invention due to the fact that one of the two first and second surface zones moves out of its originally common printed-circuit strip plane. Tensile forces on one side of the printed-circuit strip and compressive forces on the opposite edge of the printed-circuit strip are thus effectively diminished.

Besides the possibility of a printed-circuit strip in which the first and second surface zones are originally on the same common printed-circuit strip plane and move out of this original common printed-circuit strip plane upon application of bending stress in the vicinity of the bending point, the invention also opens up the further possibility of the printed-circuit strip of the type described above being designed to be bent along its entire longitudinal extension about a bend line that is parallel to the longitudinal direction, so that it is actually subdivided in the direction of its longitudinal extension into first and second surface zones, particularly alternating successively in the longitudinal direction as described above, with the first surface zones being on a first plane and the second surface zones being on a second plane that is different from the first and particularly oriented perpendicular thereto.

A connecting web that extends transverse, preferably orthogonally, to the longitudinal direction and that is designed so as to be bent about this above-mentioned parallel bend line is provided between the first and second surface zones. Accordingly, each of the respective first and second surface zones preferably has an inherently flat/planar design on mutually different planes with a merely curved connecting web between these surface zones forming the transition.

By virtue of its first and second surfaces that are oriented on different planes, such a flexible printed-circuit strip is already bendable about various bend lines perpendicular to the longitudinal direction, in particular namely at least about one such bend line that is parallel to the plane of the first surface zones and, in addition, about another such bend line that is parallel to the plane of the second surface zones.

The flexible printed-circuit strip according to the invention is thus bendable about at least two mutually perpendicular bend lines, resulting overall in basically arbitrary spatial bendability and hence also three-dimensionally deformable about the longitudinal direction due to the succession of alternating first and second surface zones over the entire length of such a printed-circuit strip.

As a matter of principle, a flexible printed-circuit strip of the above-mentioned embodiments can be of any length, with production engineering presumably posing the only limitations in terms of the maximum printed-circuit strip length.

The invention can now be preferably used to create an LED luminaire in a elongated and flexible casing with such a printed-circuit strip according to the invention, preferably with one in which the first and second surface zones are already on mutually perpendicular planes.

For example, in such an LED luminaire, the printed-circuit strip can be mounted to inside faces of the casing with only the first surfaces and/or with only the second surfaces, for example by gluing.

Especially preferably, however, according to the invention a flexible printed-circuit strip is embedded in a casting compound with the first and second surface zones lying on mutually perpendicular planes inside the casing.

Such an LED luminaire as a whole forms an elongated body with a longitudinal direction that preferably has a constant, particularly rectangular, cross section perpendicular to the longitudinal direction and preferably has light emission, more preferably uniformly point-free light emission from at least one of the elongated sides.

By virtue of the above-described flexibility of the printed-circuit strip that is achieved according to the invention, an LED luminaire that is embodied in this way with the overall flexible casing can be repeatedly bent, particularly twisted, about a plurality of differently oriented, particularly mutually perpendicular bend lines without any problem, i.e., without any loss of functionality.

Bending the printed-circuit strip according to the invention with mutually orthogonally oriented first and second surface zones is unproblematic in this respect because, when bending occurs about two different mutually perpendicular bend lines, one of the bend lines can always be oriented in or parallel to one of the two surface zones (for example the first one) and the bend line that is oriented orthogonally thereto can always be oriented in or parallel to the respective other (for example the second) surface zone. In both cases, bends thus always occur about bend lines that are parallel to a plane that is present in the specific planar orientation in the printed-circuit strip.

The remaining descriptions of preferred embodiments that follow relate fundamentally to both of the arrangements of the printed-circuit strip according to the invention described above, namely both to the embodiment in which first and second surface zones are arranged within a common plane, and to the embodiment in which the first and second surface zones are arranged on mutually different, particularly mutually perpendicular planes.

Features described in the following that are implemented on one of the faces of the strip or make reference thereto are to be understood such that these features are also implemented simultaneously on the other, particularly perpendicular plane relative to the opposite strip face.

This is understandable insofar as the second embodiment results from simply bending the first embodiment along a bend line parallel to the longitudinal direction, which is on a common plane of the first embodiment or at a spacing parallel thereto. For example, their projection onto the common printed-circuit strip plane can form the above-mentioned common longitudinal line.

Accordingly, the common longitudinal line described above can thus form for the user, at least substantially, the longitudinal line around which the user has to bend the flexible printed-circuit strip according to the invention in order to convert it from the first-mentioned embodiment according to the invention to the second one.

In accordance with the invention the flexible printed-circuit strip returns automatically from the arrangement in which it is bent onto the various planes according to the second embodiment to the common plane according to the first embodiment, i.e. relaxes, when the bending forces are removed. In such an embodiment, it is thus necessary, for example when using the printed-circuit strip according to the invention in a LED luminaire, to stabilize the circuit board strip according to the invention in the curved shape in which the first and second surface zones are oriented perpendicular to one another, which can be achieved by attaching the respective surfaces on the inside faces of the casing walls and/or by casting, for example.

However, according to the invention the flexible printed-circuit strip of the above-mentioned type is self-supporting after bending about the longitudinal line or generally about a bend line that is parallel to the longitudinal direction, meaning that it plastically retains the curved shape.

In a preferred embodiment of the invention, the first and second surface zones are each at a transverse spacing (=in the direction of width) from the longitudinal line. In the context of the invention, this is to be understood such that no printed-circuit strip material at all is present in this space, with the space between the longitudinal line and the respective first and second surface zones being thus empty, a hole.

The total transverse spacing between the surface zones, that is, the sum of the spacing from the first surface zone to the longitudinal line and from the second region to the longitudinal line, is preferably bridged according to the invention by the above-mentioned connecting web running transversely to the longitudinal line and hence across it, particularly orthogonally.

This ensures that, when the first surface zones and the second surface zones are bent relative to one another such that the first surface zones all lie on a first plane and the second surface zones all lie on a second, different plane that is particularly perpendicular thereto, exclusively by bending the connecting webs without the first and second surface zones themselves being bent for this purpose. The spacing from the above-mentioned longitudinal line makes it possible to reliably ensure that curved regions of the connecting web do not extend into the above-mentioned surface zones, but rather that the connecting web already lies on the respective plane of the surface zone to which it is adjacent before the transition of the connecting web into the first or second surface zone.

According to another preferred embodiment, the first surface zones are separated from one another in the longitudinal direction by first notches that extend perpendicular to the longitudinal direction and the second surface zones are separated from one another in the longitudinal direction by second notches that extend perpendicular to the longitudinal direction, with the respective first and second notches extending inward from the respective printed-circuit strip edge to beyond the longitudinal line. A notch is thus longer than the spacing between the above-mentioned longitudinal line and the edge of the printed-circuit strip edge from which it originates.

In the embodiment described above, in which the first and second regions lie on a common plane, the first and second notches are thus also located completely on the same common plane. However, in the embodiment in which the first and second surface zones are oriented on different planes that are particularly perpendicular to one another, the region of a respective notch that extends from a strip edge in the direction of the longitudinal line is arranged on the same plane of those surface zones between which the open starting region of a notch, with the closed inner region of a notch that extends over the longitudinal line as described above lying on the other plane that is particularly perpendicular thereto in this end region that reaches over the longitudinal line.

The notches are preferably tapered in width from the printed-circuit strip edge toward the center of the strip. In particular, the edge profile of a closed end region of a notch can be rounded in the vicinity of the longitudinal line. Such rounding can describe a 180° bend of the edge that is formed between two parallel notch edges at the end of the above-mentioned tapered region of a notch.

The first and second surface zones each have a certain length in the longitudinal direction of the printed-circuit strip.

In that regard, according to the invention all the first surface zones always have a fixed length, just as all the second surface zones can have a fixed length.

However, one embodiment that is preferred according to the invention is also that one of the surface zones, particularly the first surface zone cited here, can have different lengths in the longitudinal direction. In particular, such a surface zone can have a first and a second length in the longitudinal direction and be arranged successively in these different lengths in the longitudinal direction.

For instance, when considering only one of the strip faces, a first surface zone of a greater length separated by a first notch can be followed by at least one or more first surface zones of a second, shorter length. In particular, if one of the surface zones, such as a first surface zone can have different lengths along the strip, the notches, particularly the second notches between the second surface zones on the other strip side, have different notch widths in like manner, particularly if the connecting webs between the surface zones always have the same length in the longitudinal direction.

Preferably, the connecting webs, particularly the bent connecting webs, connect adjacent first and second surface zones at their respective end regions lying in the longitudinal direction, particularly lying laterally opposite one another.

When viewed in the longitudinal direction, the first and second surface zones lying on both edge regions of the printed-circuit strip according to the invention thus have an overlap at their two inner ends that corresponds to the width of the connecting web between these surface zones.

In accordance with the invention an electrical contact, for example for powering the electronic components on the printed-circuit strip, can be established both on the upper face and on the lower face of the printed-circuit strip or of the surface zones.

Preferably, the upper face is understood to mean that face of a surface zone on which active electronic components are arranged, such as light-emitting diodes or sensors, for example. Accordingly, the upper face is that face of a surface zone from which a light-emitting diode emits its light to the outside or from which a sensor detects the environment. The lower face is the face opposite such a surface.

Preferably, according to the invention an electrical contact is provided exclusively on the lower face of only one of the two surface zones, in particular of the first surface zone here. This is particularly the case if, according to the invention, active electronic components, such as light-emitting LEDs, for example, are mounted only on the first surface zones.

In one embodiment of this type, for example, the second surface zones do not carry any additional active electronic components, particularly no light-emitting diodes, are thus passive with respect to electrical functionality, and essentially contribute only to the implementation of the inventive bendability in this embodiment.

Particularly if the second surface zones do not carry any active electronic components, preferably if they have only conductor conductive traces, according to the invention every second surface zone in the surface is smaller than the first surface zones.

As will readily be understood, in the invention active electronic components, such as light-emitting diodes or also other sensors, for example, are on both the first and the second surface zones.

If at least (or only) the first surface zones are provided with electronic components, such as light-emitting diodes or other active elements or sensors, for example, according to the invention the second surface zones is bent out of the plane of the first surface zones (i.e. of the first embodiment of the printed-circuit strip) by an angle toward the surface of the first surface zones carrying the electronic components (in order to make the second embodiment of the printed-circuit strip). The first and second surface zones thus form the above-mentioned angle, with the electronic components of at least the first surface zones being in the enclosed angular region and, optionally, those in the second surface zones as well.

In addition to the electronic components, conductive traces in the form of metallized surface zones, i.e. electrically conductive areas, are also provided on a printed-circuit strip of the type according to the invention. A preferred embodiment of the invention can also make a provision that the printed-circuit strip is subdivided on the upper face and on the lower face into two laterally adjacent, electrically conductive traces, each of which extends along the entire length of the printed-circuit strip, and that the upper face and lower face are separated from each other by an insulating region preferably extending so as to undulate or meander through the first surface zones, the connecting webs, and the second surface zones. As a result, it is possible to conduct the two potentials required for the operation of such a printed-circuit strip along the entire length of the printed-circuit strip.

According to one especially preferred embodiment the electrically conductive traces on the upper face and lower face are opposite one another in a surface zone (for example the first surface zone) and conduct different electrical potentials, and that electrically conductive traces that carry the same electrical potential are situated opposite one another in the other surface zone (for example the second surface zone). This arrangement can also be exactly the opposite with respect to the first and second surface zones.

In that case, one lateral side of the entire printed-circuit strip has only one potential, whereas the other side of the entire printed-circuit strip has both potentials. Feedthroughs, so-called vias, can be provided between upper and lower faces of the printed-circuit strip and/or upper and lower face of a respective first or second surface zone.

According to one structurally preferred embodiment, the laterally outward regions of the printed-circuit strip edge are elongated and rounded and transition into these notches in the region of transition to the notches, and/or the notches are rounded at the respective closed notch end. This rounding on the outer edge prevents sharp angles, thus reducing notch forces and preventing the printed-circuit strip according to the invention from cracking as a result of the multiple changes in direction of the outer strip edge.

Moreover, according to the invention the printed-circuit strip according to the invention comprises a plurality of successive independent electronic units distributed along direction of its longitudinal extension that are supplied with power particularly in parallel circuits, with each independent unit more preferably covering at least two first and two second surface zones, and with a separating region being provided between two respective independent units at which the printed-circuit strip can be severed perpendicular to the longitudinal extension while maintaining the function of the units on both faces of the point of separation.

As a result, a printed-circuit strip or also the LED luminaire that is preferred as an application that comprises such a printed-circuit strip in a flexible casing, for example in a cast design, can be separated at multiple points of separation that are each separated by the length of an independent unit.

It is thus possible to produce not only a printed-circuit strip but also, optionally, an LED luminaire or other electrical device designed therewith that is substantially endless apart from lengths that are limited due to considerations involving production engineering in order to then be cut to a desired application-related length only after production at the point of separation provided for this purpose.

BRIEF DESCRIPTION OF THE DRAWING

Preferred embodiments of the invention will explained gwith reference to the figures that follow, in which.

SPECIFIC DESCRIPTION OF THE INVENTION

Figure 1:
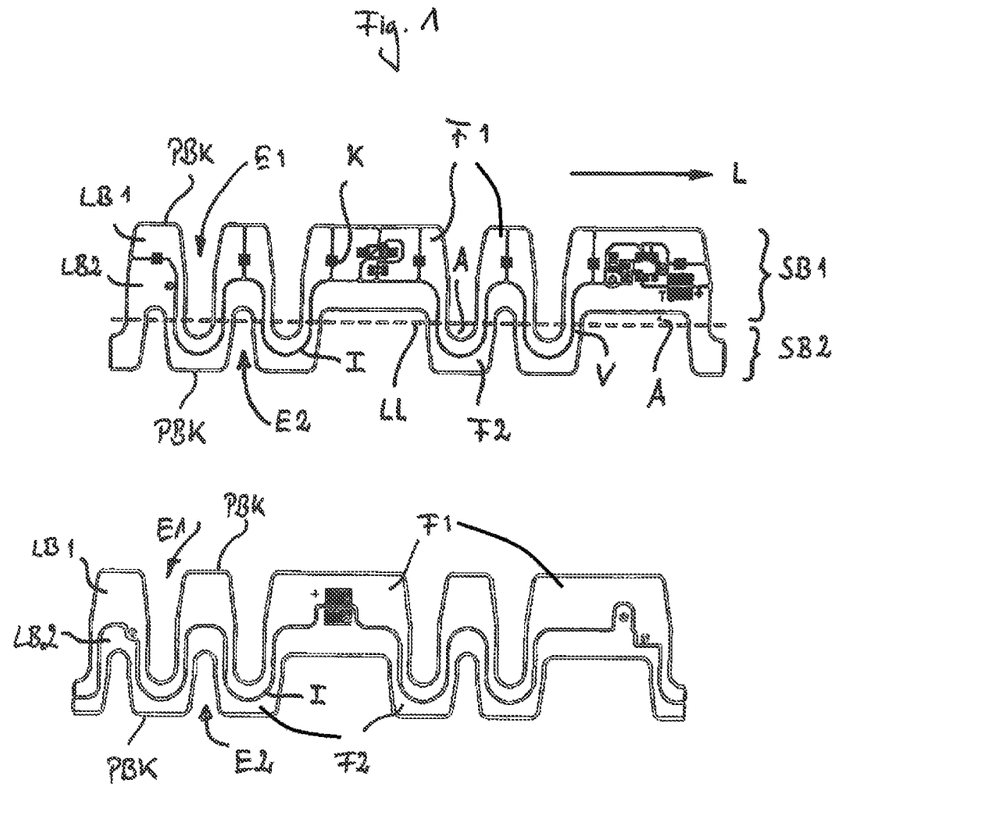
FIG. 1 is a top view of the printed-circuit strip according to the invention.

FIG. 1 shows a printed-circuit strip according to the invention extending in a longitudinal direction L, made of a flexible substrate film, for example of polyimide, and preferably provided on one or both faces with conductive traces and/or electronic components K, here for example light-emitting diodes.

The embodiment described here shows that, in the longitudinal direction L, the printed-circuit strip is subdivided into first surface zones F1 and second surface zones F2 that alternate with one another longitudinally, with the first surface zones F1 being in a first edge region SB1 and with the second surface zones F2 in a second edge region SB2. The two edge regions SB1 and SB2 are separated by a longitudinal line LL and thus flank this imaginary line that is shown dashed here, so that this line represents the boundary between the two above-mentioned edge regions SB1 and SB2.

Each first surface zone F1 is connected in an electrically conductive manner to at least one second longitudinally adjacent surface zone F2 by a connecting web V, with the connecting web V extending transversely across the longitudinal line LL, particularly crossing the longitudinal line LL at an arbitrary angle and preferably orthogonally. The connecting web V is therefore never parallel to the longitudinal line L with its central direction of extension and is preferably perpendicular thereto.

In longitudinal direction L, the first surface zones F1 are separated from one another on their strip edge region SB1 by first notches E1 and the second surface zones F2 are separated from one another on their strip edge region SB2 by second notches E2, with each notch E1 or E2 extending from the respective strip edge PBK toward the center of the strip and past the longitudinal line LL. Each notch E1, E2 thus begins with its open region at the respective printed-circuit strip edge PBK and extends toward and beyond the longitudinal line, so that it extends from one lateral region, for example SB1, into the other lateral region, for example SB2.

Both the first surface zones F1 and the second surface zones F2 are set outward at a spacing A from the longitudinal line LL, which means that no printed-circuit strip material, particularly also no substrate film such as polyimide, for example, is in this space A. This means that, overall, the printed-circuit strip according to the invention has a wave-shaped, particularly meandering extension in the longitudinal direction L, with the surface zones F1 and F2 of the printed-circuit strip flanking the longitudinal line LL at the spacing A and crossing same exclusively in the connecting webs. The spacing A can be the same on both sides of the longitudinal line LL but also different.

In the preferred application, the printed-circuit strip carries light-emitting diodes as electrical components, for example, so that the invention can constitute a so-called LED strip. In addition to the light-emitting diodes, electronic components can also be mounted on the first and/or second surface zones as required for the operation of the light-emitting diodes, such as sources of constant current or voltage.

In the printed-circuit strip shown in FIG. 1, the surface zones F1 and the surface zones F2 lie in a common plane, here the plane of the view. Nevertheless, there turns out to be a bendability of the printed-circuit strip shown here both about a bend line that lies on the plane of the view and about a bend line that is perpendicular to the plane of the view and perpendicular to the longitudinal line LL.

In the case of such bending about a bend line that is perpendicular to the plane of the view, tensile and compressive forces at the opposite printed-circuit strip edges PBK can be prevented or at least reduced by virtue of the fact that either both of the surface zones F1 and F2 move out of their common plane or at least one of the two surface zones moves out of the common plane relative to the other surface zone.

Figure 2:
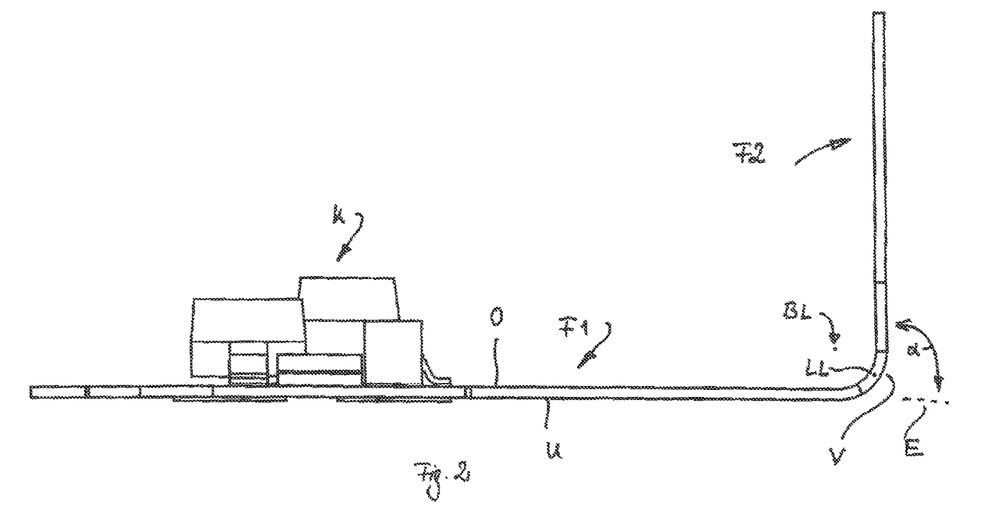
FIG. 2 is an end view of the strip after deformation into an L-shape.
Figure 3:
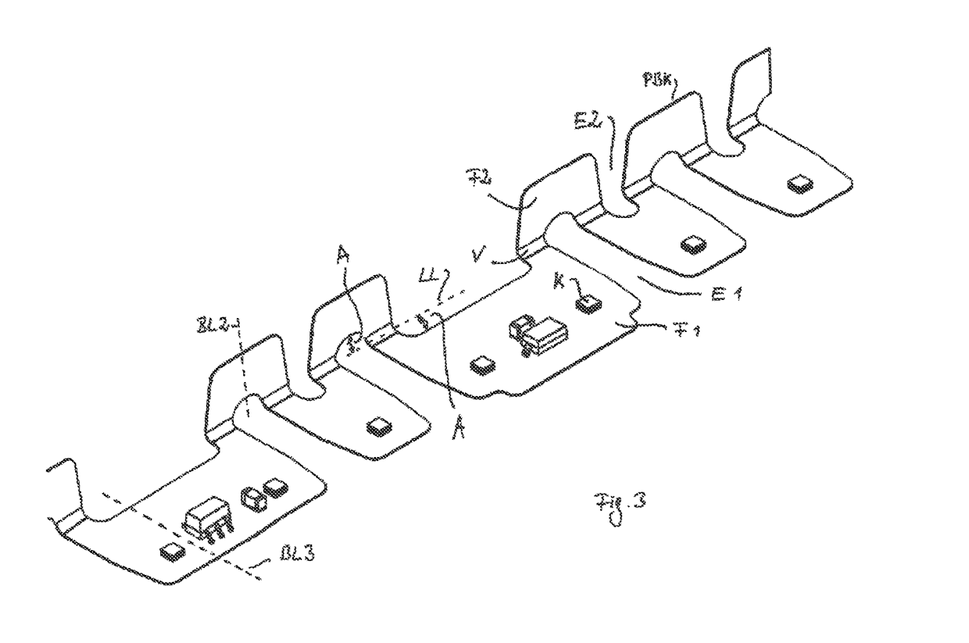
FIG. 3 is a perspective view of the strip as shown in FIG. 2.
Figure 4A:
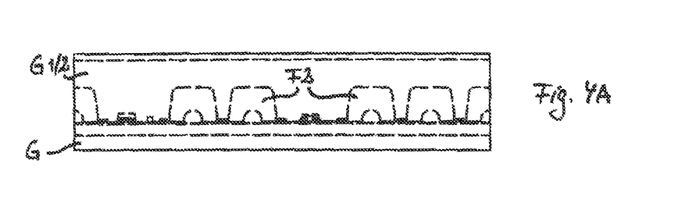
FIGS. 4A and 4B are side and top views of the strip installed in a U-section casing.
Figure 4B:
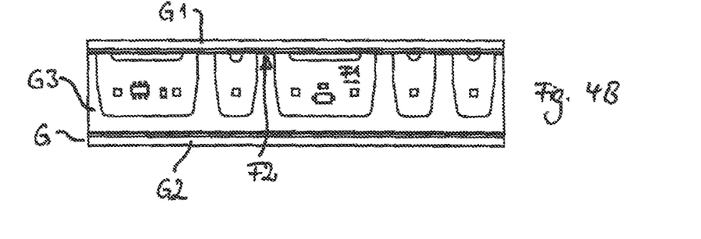
Figure 4C:
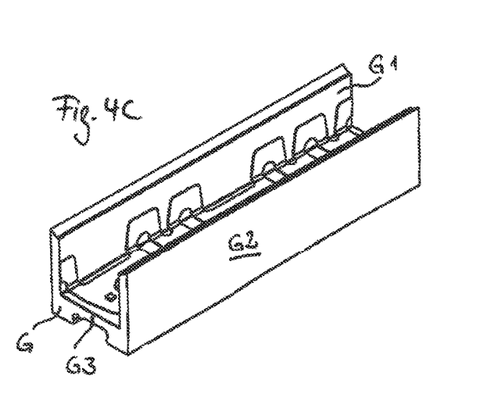
FIG. 4C is a perspective view of the structure of FIGS. 4A and 4B.
Figure 4D:
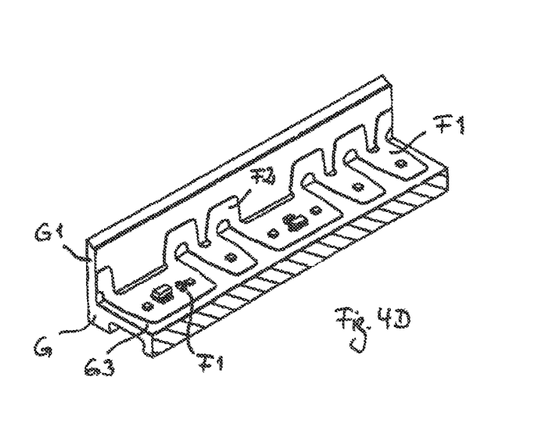
FIG. 4D is a view like FIG. 4C but with one leg of the casing removed.
Figure 4E:
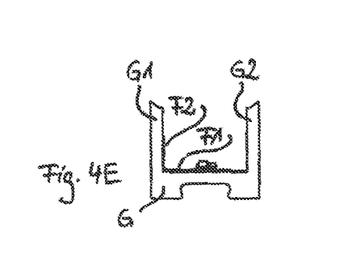
FIG. 4E is an end view of the structure shown in FIGS. 4A-4D.

The printed-circuit strip of FIG. 1 can also be understood as merely an intermediate product for making the embodiment of FIGS. 2 and 3.

FIGS. 2 and 3 show different views of a variant of the printed-circuit strip according to the invention, here for example with LEDs as components K on the first surface zones F1, with the surface zones F1 on a first plane and the surface zones F2 on a second plane that is perpendicular thereto. The surface zones F2 are each smaller in terms of surface area than the first surface zones, being particularly of different sizes.

The connecting webs V over which the two surface zones F1, F2 merge into one another have a bent region that corresponds to the angular spacing of the two planes of the surface zones F1 and F2, namely the angle α. The specific bend line BL can here be at a spacing from the planes of the surface zones F1 and F2, whereas the longitudinal line LL can lie within the material of the printed-circuit strip, particularly the polyimide film, as indicated in FIG. 2.

It can be seen, in particular in FIG. 2, that the surface zones F1 and F2 are inherently completely planar but are on different mutually perpendicular planes, the bending of the printed-circuit strip being realized exclusively in the connecting webs V that connect the surface zones F1, F2.

According to FIG. 2, the surface zone F2 has moved from the originally common plane E with the surface zone F1 toward the surface O or the electronic components K that are arranged on the surface zone F1.

The embodiment described here according to FIGS. 2 and 3 has the advantage that, in this pre-bent configuration in which the surface zones F1 and F2 lie on mutually perpendicular planes, the printed-circuit strip can be bent multiply about a bend line, particularly in each of the surface zones F1, namely in a trouble-free and non-destructive manner about a bend line that lies in or parallel to the respective surface zone.

As illustrated in FIG. 3, this results in additional bend lines BL2 and BL3, for example, which are oriented on or parallel to the plane of one of the surface zones and about which the respective surface zone can be bent in a non-destructive manner. Altogether, by virtue of the sequence of the plurality of first and second surface zones F1 and F2, the printed-circuit strip according to the invention can thus be bent three-dimensionally, without mechanically overstressing a conductive trace or electronic component.

Such a printed-circuit strip according to FIG. 3 and in the sectional view of FIG. 2 can be installed in a casing, for example, in which case the surface zones F1 and F2 are each parallel to a respective wall of the casing. For example, such a printed-circuit strip can be anchored in such a casing by casting.

FIG. 1 also illustrates a design that can be implemented in the embodiments of FIGS. 2 and 3, even though this is not shown there. For example, this is the case if the bent printed-circuit strip of FIGS. 2/3, as a result of bending, the connecting web about a bend line BL follows from the printed-circuit strip of FIG. 1.

FIG. 1 shows that transversely, i.e. perpendicular to the longitudinal direction, the printed-circuit strip is not only subdivided into the lateral strip regions SB1 and SB2, but rather that further electrical subdivision into conductive traces LB1 and LB2 is performed independently of this subdivision.

These conductive traces can represent areas of planar metallization that are separated from one another by an insulating region I of a linear and meandering type, for example. The conductive traces LB1 and LB2 can have either the same potential or also different potential depending on the face (upper or lower face) of the printed-circuit strip.

Such a subdivision into the conductive traces LB1 and LB2 is provided according to the invention both on the upper face and on the lower face of the printed-circuit strip, with electrically conductive traces that conduct different electrical potential being situated opposite one another on the upper face and lower face in a defined surface zone, for example in the first surface zone, and with electrically conductive traces that conduct the same potential being situated opposite one another on the upper face and lower face in another surface zone, for example the second surface zone F2. In the embodiment shown here, it can thus be achieved that the electronic components K in a first surface zone F1, are powered of the resulting potential difference between the upper face and lower face of this surface zone F1.

As a whole, the illustrated embodiments also show that the respective notches E1 and E2 extend inward between the surface zones, i.e. between the respective first surface zones or between the surface zones and extend first from the printed-circuit strip edge PBK, inward, and thus have a tapered region that then transitions into a region of uniform width which, after passing the longitudinal line LL, terminates in a rounded region.

In particular, all of the edges of the printed-circuit strip edge PBK, which meanders overall and on both side regions SB1/SB2, have a rounded shape in all regions in which the printed-circuit strip edge undergoes a change in angle of greater than 45° in its extension, thereby reducing notch forces and preventing the printed-circuit strip edge from being cracking when bent.

FIG. 4 shows various views of an LED luminaire in which a printed-circuit strip according to the invention is used. The luminaire comprises a U-shaped casing G with two opposite legs G1 and G2 that extend upward from a bottom G3. In order to make the printed-circuit strip more identifiable, FIG. 4D shows only the leg G1.

The printed-circuit strip has a curved shape, as explained with reference to FIGS. 2 and 3, with all of the features described with reference to these figures.

FIG. 4 shows clearly that the surface zones F1 rest on, particularly are fastened to, the bottom G3 of the casing G, for example by glue. The surface zones F2 arranged at 90° relative thereto abut against one of the legs, here the leg G1. In particular, the surface zones F2 can be fastened to the leg G1, for example by gluing.

The electronic components K, such as light-emitting diodes, for example, that are in the surface zones F1 are directed into the interior of the casing G; in particular, light-emitting diodes thus emit their light into the interior of the luminaire, i.e. into the region between the legs G1/G2.

FIG. 4 shows the casing of the luminaire in an uncast state.

Figure 5:
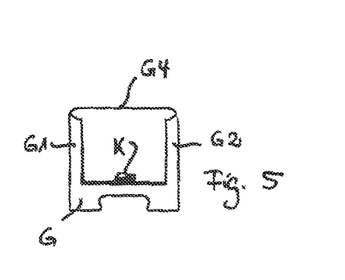
FIG. 5 is a view like FIG. 4E but with the casing filled with potting.

FIG. 5 shows a cross-sectional illustration of a luminaire that is filled with casting compound, which then also seals the casing G with the upper face G4 and forms a light-emitting surface. The casting compound can be at least partially opaque in order to scatter light and produce a homogeneous illumination at the light-emitting surface G4, in which the individual light-emitting diodes cannot be seen individually as individual light sources. The casing G can be hermetically sealed by the casting compound.

The invention claimed is:

1. A flexible longitudinally extending plastic strip having an upper face and a lower face and first and second longitudinally extending edges, the strip being subdivided transversely by a longitudinal line into a first edge region extending along the first longitudinal edge of the strip and a second edge region extending along the second longitudinal edge of the strip, the strip being unitarily formed by:
   a plurality of longitudinally spaced first surface zones wholly to one side of the line in the first edge region,
   a plurality of longitudinally spaced second surface zones wholly to another side of the line in the second edge region;
   a plurality of connecting webs extending transversely across the line and each connecting a respective one of the first surface zones to a respective one of the second surface zones;
   a plurality of electrical components carried on the upper and/or lower faces of the first or second surface zones between the longitudinal line and the respective strip edge;
   first and second notches formed in the respective first and second edge regions, between the components, and each extending from the respective first and second longitudinal edges inward past the longitudinal line; and
   first and second electrically conductive traces extending longitudinally in the edge regions and transversely between the edge regions in the webs a full length of the strip on at least one of the faces thereof, connected between the electrical components, and insulated from each other.

2. The printed-circuit strip according to claim 1, wherein the notches taper inwardly in width from the respective printed-circuit strip edges toward a center of the strip.

3. The printed-circuit strip according to claim 1, wherein the first surface zones are bent relative to the second surface zones at the connecting webs about a bend line that is parallel to the longitudinal direction onto another, particularly perpendicular plane.

4. The flexible printed-circuit strip defined in claim 1, wherein the first surface zones are on a first plane and the second surface zones are on a second plane oriented differently from the first and wherein a connecting web that extends perpendicular to the longitudinal direction is embodied so as to be bent about a bend line that is parallel to the longitudinal direction.

5. The printed-circuit strip according to claim 4, wherein the bent connecting webs connect the adjacent first and second surface zones at their respective longitudinally spaced end regions.

6. The printed-circuit strip according to claim 4, wherein the second surface zones are bent out of the plane of the first surface zones by an angle toward the surface of the first surface zones carrying the electronic components.

7. The printed-circuit strip according to claim 1, wherein the strip is electrically contacted exclusively on the lower face that is situated opposite the upper face of the first surface zones carrying the electronics components.

8. The printed-circuit strip according to claim 1, wherein the electrically conductive traces on the upper face and lower face are situated opposite one another in the first surface zone and conduct different electrical potentials, and in that the electrically conductive traces that carry the same electrical potential are situated opposite one another in the second surface zone.

9. The printed-circuit strip according to claim 1, wherein the printed-circuit strip edge is elongated and rounded and transition into the notches in the region of transition to the notches or the notches are rounded at a closed notch end.

10. The printed-circuit strip according to claim 1, wherein the strip comprises a plurality of successive longitudinally spaced independent electronic units that are supplied with power in parallel circuits, with each independent unit bridging at least two first and two second surface zones, and with a separating region being provided between two respective independent units, whereby the printed-circuit strip can be severed perpendicular to the longitudinal extension while maintaining the function of the units on both sides of the point of separation.

11. An LED luminaire comprising a printed-circuit strip according to claim 1, further comprising:
   an elongated flexible casing holding the strip, and
   casting compound anchoring and embedding the strip in the casing.

12. The combination defined in claim 1, wherein each of the connecting webs has a longitudinal dimension measured parallel to the longitudinal line that is smaller than a longitudinal dimension of any of the first and second surface zones.

13. The combination defined in claim 12, wherein the webs are free of any electrical components.

14. The combination defined in claim 1, wherein the electrical components are only on the first surface zones.

15. The combination defined in claim 1, wherein the strip is of polyimide.

* * * * *